United States Patent
Roohparvar

(10) Patent No.: US 6,662,279 B2
(45) Date of Patent: Dec. 9, 2003

(54) DQ MASK TO FORCE INTERNAL DATA TO MASK EXTERNAL DATA IN A FLASH MEMORY

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/801,216

(22) Filed: Mar. 7, 2001

(65) Prior Publication Data

US 2002/0129190 A1 Sep. 12, 2002

(51) Int. Cl.$^7$ .............................................. G06F 12/12
(52) U.S. Cl. ...................... 711/155; 711/154; 711/159; 365/185.29; 365/189.01
(58) Field of Search ........................... 711/4, 100–105, 711/155, 154, 159; 365/189.01, 189.05, 195, 196, 185.29, 185.01

(56) References Cited

U.S. PATENT DOCUMENTS

| | | | | |
|---|---|---|---|---|
| 5,983,314 A | | 11/1999 | Merritt | |
| 6,034,916 A | * | 3/2000 | Lee | 365/193 |
| 6,047,352 A | * | 4/2000 | Lakhani et al. | 711/5 |
| 6,198,664 B1 | * | 3/2001 | Fastow | 365/185.29 |
| 6,222,775 B1 | * | 4/2001 | Cappelletti | 365/185.29 |
| 6,223,268 B1 | * | 4/2001 | Paluch et al. | 365/195 |
| 6,240,495 B1 | * | 5/2001 | Usui | 365/189.05 |
| 6,286,077 B1 | * | 9/2001 | Choi et al. | 365/189.01 |
| 6,298,426 B1 | * | 10/2001 | Ajanovic | 365/230.03 |
| 6,389,504 B1 | * | 5/2002 | Tucker et al. | 345/552 |
| 6,456,542 B1 | * | 9/2002 | Roohparvar | 365/189.12 |

* cited by examiner

*Primary Examiner*—T. V. Nguyen
(74) *Attorney, Agent, or Firm*—Leffert Jay & Polglaze P. A.

(57) ABSTRACT

A method of masking input data in a synchronous non-volatile flash memory. According to one embodiment of the present invention, a data mask connection is used to receive a mask signal. The mask signal forces at least a portion of input data having a programmed state to an erased state. In another embodiment, control circuitry is used to control write operations to memory cells of a memory array. In this embodiment, the control circuitry does not write input data having an erased state to the memory array.

43 Claims, 3 Drawing Sheets

DQ MASK TO FORCE INTERNAL DATA TO MASK EXTERNAL DATA IN A FLASH MEMORY

TECHNICAL FIELD OF THE INVENTION

The present invention relates generally to non-volatile memory devices and in particular the present invention relates to a method of masking input data in synchronous non-volatile flash memory.

BACKGROUND OF THE INVENTION

Memory devices are typically provided as internal storage areas in the computer. The term memory identifies data storage that comes in the form of integrated circuit chips. There are several different types of memory, including random access memory (RAM). This is typically used as main memory in a computer environment. Most RAM is volatile, which means that it requires a steady flow of electricity to maintain its contents. As soon as the power is turned off, whatever data was in RAM is lost.

Computers can contain a small amount of read-only memory (ROM) that holds instructions for starting up the computer. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a flash memory. A flash memory is a type of EEPROM that can be erased and reprogrammed in blocks instead of one byte at a time. Many modern computers have their basic I/O system bios stored (BIOS) on a flash memory chip so that it can easily be updated if necessary. Such a BIOS is sometimes called a flash BIOS. Flash memory is also popular in modems because it enables the modem manufacturer to support new protocols as they become standardized.

A typical flash memory comprises a memory array that includes a large number of memory cells arranged in row and column fashion. Each of the memory cells includes a floating gate field-effect transistor capable of holding a charge. The cells are usually grouped into erasable blocks. Each of the memory cells can be electrically programmed in a random basis by charging its floating gate. The charge can be removed from the floating gate using a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. A SDRAM can be accessed quickly, but is volatile.

A SDRAM, as well as other conventional memory, is designed to selectively mask data. That is, a SDRAM can selectively screen out or let through certain bits in a data value. This masking ability allows the SDRAM to process data efficiently. For example, data, which does not need to be reloaded, can be masked when data is written. Moreover, data, which does not need to be outputted to an external device, is masked when the data is read. Having the masking ability, allows the SDRAM to eliminate time spent writing and reading data that is not needed. Like the SDRAM, a Flash memory that had the ability to efficiently mask data would enhance the performance of a Flash memory device.

For the reasons stated above, and for other reasons stated below which will become apparent to those skilled in the art upon reading and understanding the present specification, there is a need in the art for a flash memory that has the ability to efficiently mask data.

SUMMARY OF THE INVENTION

The above-mentioned problems with memory devices and other problems are addressed by the present invention and will be understood by reading and studying the following specification.

In one embodiment, the present invention provides a flash memory device having a data mask connection to receive a mask signal. The mask signal forces at least a portion of input data having a programmed state to an erased state.

In another embodiment, a flash memory devise comprises a data connection, a data mask connection, and a mask logic circuit. The data connection is used to receive an input data signal. The data mask connection receives a mask signal used to selectively mask the input data signal. The mask logic circuit is coupled to provide an output data signal in response to the input data signal and the mask signal. The output data signal of the mask logic circuit provides data in a logic 1 state in response to the input data signal having a logic 1 state or the assertion of the mask signal.

In another embodiment, a flash memory device comprises a DQ connection to receive input data, a DQMASK connection to receive an active high mask signal, and a mask logic circuit having a first input coupled to the DQ connection and a second input coupled to the DQMASK connection. The mask logic circuit outputs data having an erased state in response to input data having an erased state or an assertion of the mask signal.

In another embodiment, a flash memory device comprises a memory array having a plurality of memory cells, control circuitry, a DQ connection, and a DQMASK connection. The control circuitry is used to control write operations to the memory cells. Moreover, the control circuitry writes only logic 0 data to the memory array. The DQ connection is used to receive input data. The DQMASK connection is used to receive an active high mask signal. The mask logic circuit has a first input coupled to the DQ connection and a second input coupled to the DQMASK connection. The mask logic circuit outputs logic 1 data in response to input data having a logic 1 data or an assertion of the mask signal.

In another embodiment, a flash memory system comprises a processor, a flash memory, a DQ connection, a DQMASK connection, a mask logic circuit, and control circuitry. The processor provides input data. The flash memory stores the input data from the processor. The flash memory comprises memory cells arranged in columns and rows. The DQ connection is coupled to receive the input data and the DQMASK connection is used to receive a mask signal used to selectively mask the input data. A mask logic circuit is coupled to provide output data in response to the input data and the mask signal. The output data of the mask logic circuit has a logic 1 state in response to the mask signal. The control circuitry performs a write operation to store the output data in the memory cells. Moreover, the control circuitry does not write data having a logic 1 state to the memory cells.

In another embodiment, a flash memory system comprises a processor, a flash memory array, a DQ connection, a DQMASK connection, and control circuitry. The processor to provides input data. The flash memory array stores the input data in memory cells arranged in columns and rows. The DQ connection is used to receive the input data. The DQMASK connection receives a mask signal used to selectively mask at least a portion of the input data having a programmed state to an erased state. The control circuitry performs a write operation to the memory cells of the flash memory array. Moreover, the control circuitry does not write data having an erased state to the memory cells.

In another embodiment, a flash memory device comprises a DQ connection, a data input latch, a DQMASK connection, and a mask logic circuit. The DQ connection is used to receive an input data signal. The data input latch has an input coupled to the DQ connection. The DQMASK connection is used receive a mask signal. The mask logic circuit has a first input coupled to an output of the data input latch and a second input coupled to the DQMASK connection. The mask logic circuit outputs data in a logic 1 state in response to the first input of the mask logic circuit receiving data in a logic 1 state or the assertion of the mask signal.

In another embodiment, a flash memory device comprises a data connection, a data mask connection, a mask logic circuit and a data input latch. The data connection is used to receive input data. The data mask connection receives a mask signal that is used to selectively mask at least a portion of the input data having a programmed state to an erased state. The mask logic circuit has a first input coupled to the data connection and a second input coupled to the data mask connection. The mask logic circuit outputs data in an erased state in response to input data in an erased state or the assertion of the mask signal. The data input latch is coupled to receive the output data from the mask logic circuit.

A method of operating a flash memory comprises receiving input data to be stored in a memory array and masking select bits of the input data by forcing the select bits to an erased state.

Another method of operating a flash memory comprises performing a write operation to a flash memory array and masking a selected portion of input data by changing the selected portion to a logic 1 state data.

Another method of operating a flash memory comprises receiving a data signal on a DQ connection to be stored in a memory array, receiving a mask signal on a DQMASK connection to selectively mask the data signal, masking the data signal by forcing the data signal to an erased state and storing only input data having a programmed state in the memory array.

Another method of operating a flash memory comprises, executing a write operation, masking data to be written to a memory array by forcing a selected portion of the data to an erased state, storing data having a programmed state in the memory array and ignoring data in an erased state.

Another method of operating a flash memory comprising, erasing a block of memory cells in a memory array, performing a write operation to the block of memory cells, masking a selected portion of input data by forcing data having a programmed state in the selected portion to data having an erased state and storing data having a programmed state in the block of memory cells.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
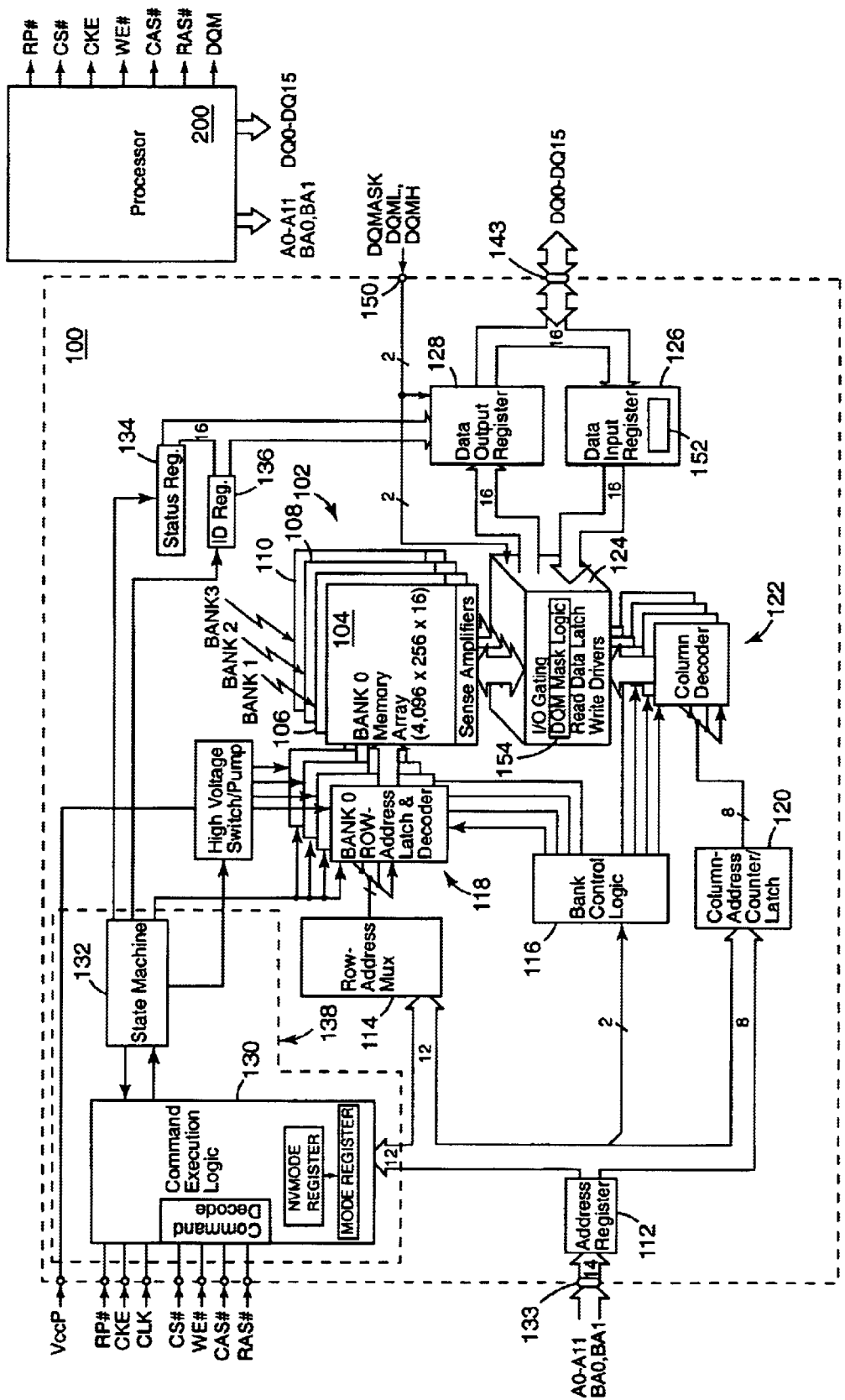
FIG. 1 is an illustration of an embodiment a synchronous flash memory of the present invention.

An example of a recently developed flash memory that benefits from the present invention is a synchronous flash memory. The synchronous flash memory combines the non-volatile storage capacities of flash memory with a SDRAM compatible interface. An embodiment of a synchronous flash memory is illustrated in FIG. 1. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 via address signal connections. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128 via data connections. Command execution logic 130 is provided to control the basic operations of the memory device. A state machine 132 is also provided to control specific operations performed on the memory array and cells. The command circuit 130 and/or state machine 132 can be generally referred to as control circuitry 138 to control read, write, erase and other memory operations. A status register 134 and an identification register 136 can also be provided to output data. The data connections (DQ) 143 are typically used for bi-directional data communication. The memory can be coupled to an external processor 200 for operation or testing.

The synchronous flash memory array architecture is designed to allow blocks of memory cells to be erased without disturbing the rest of the array. The array is divided into 16 addressable blocks that are independently erasable. By erasing blocks rather than the entire array, the total device endurance is enhanced, as is system flexibility. The array is equally divided into four banks 104, 106, 108 and 110 of four blocks each (16 blocks). The four banks have simultaneous read-while-write functionality. That is, a WRITE or ERASE operation to any bank can occur simultaneously to a READ operation to any other bank. The memory blocks are read, written and erased by issuing commands to the command execution logic 130 (CEL).

WRITE and ERASE operations are accomplished by manipulating charges in memory cells in the flash memory array. If a charge is stored on a floating gate of a memory cell, the memory cell is said to have a logic 0 state (logic 0) or a programmed state. If there is no charge on the floating gate of a memory cell, the memory cell is said to have a logic 1 state (logic 1) or erased state. Charge is stored on a floating gate of a cell transistor of a memory cell in response to input data having a logic 0 or programmed state during a write operation. A block of memory cells that have been erased will have all logic 1 memory cells. Input data having a logic 1 is not written to memory cells during a write operation, regardless of the actual data stored in the memory cells. As such, the memory only writes memory cells from a logic 1 to a logic 0. Therefore, an ERASE operation must be done on a memory block prior to a WRITE operation.

The present invention, seeks to enhance the performance of the synchronous flash memory by masking input data not needed during the WRITE operation. The input/output mask (DQMASK) connection 150, similar to a SDRAM, is used by the present invention to provide a mask signal to a synchronous flash memory. Once the DQMASK has been asserted, the present invention converts data having a logic 0 state provided on the DQ connections 150 to data having a logic 1 state. Since, a WRITE operation to a flash memory does not change the content of a memory cell in response to logic 1 input data, the control circuitry 138 does not operate on the data in the memory. This action has the effect of masking the data in a simple and efficient manner.

In one embodiment of the present invention, a mask logic circuit 154 converts all logic 0 state data coming from an internal data input latch 152 to logic 1 state data when the DQMASK is asserted. As illustrated in FIG. 1, data signals received by the DQ connections 143 are passed through the data input registry 126. The data input registry 126 includes an internal data input latch 152 to buffer input data before a write operation. The data signals are then sent from the internal data input latch 152 to the mask logic circuit 154. The mask logic circuit 154 is illustrated as part of circuit 124 in FIG. 1.

Figure 2:
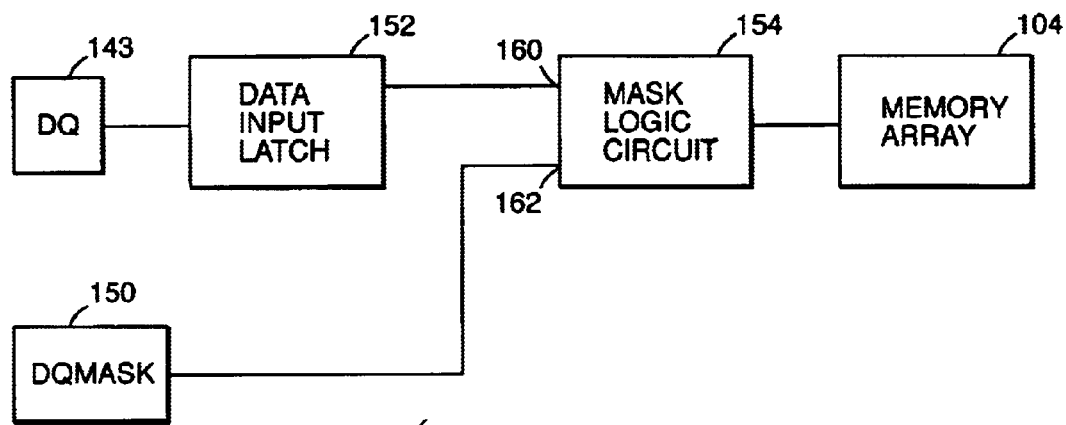
FIG. 2 is a block diagram of one embodiment of the present invention.
Figure 4:
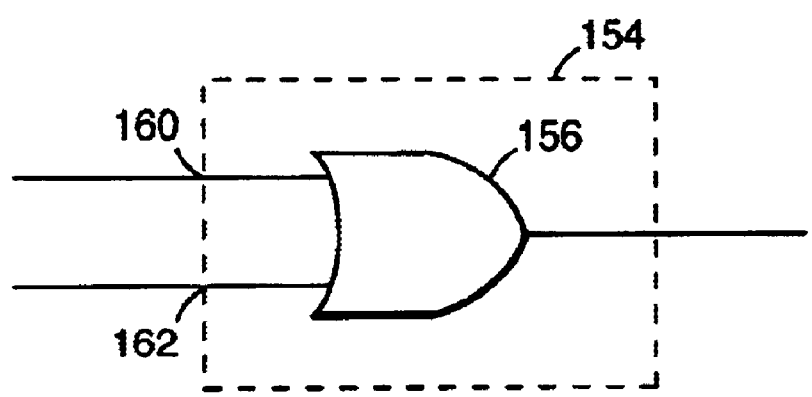
FIG. 4 is a logic OR gate of another embodiment of the present invention.

A simplified block diagram of this embodiment is illustrated in FIG. 2. As illustrated, the DQ connections 143 are coupled to an input of the internal data input latch 152. An output of the internal data input latch 152 is coupled to a first input 160 of the mask logic circuit 154. The DQMASK connection 150 is coupled to a second input 162 of the mask logic circuit 154. The mask logic circuit 154 outputs data having a logic 1 state if either data in the output of the internal data latch 152 is in a logic 1 state or the DQMASK connection 150 provides data having a logic 1 state (an active high signal). The output of the DQM logic circuit 154 is coupled to the memory array 104. The DQM logic circuit 154 in one embodiment includes a logic OR gate 156, as illustrated in FIG. 4. Although, the DQMASK connection 150 is described as providing an active high state, it will be appreciated by those in the art that the DQMASK connection could provide an active low state and still provide the same results by implementing different logic elements in the logic circuit 154.

Figure 3:
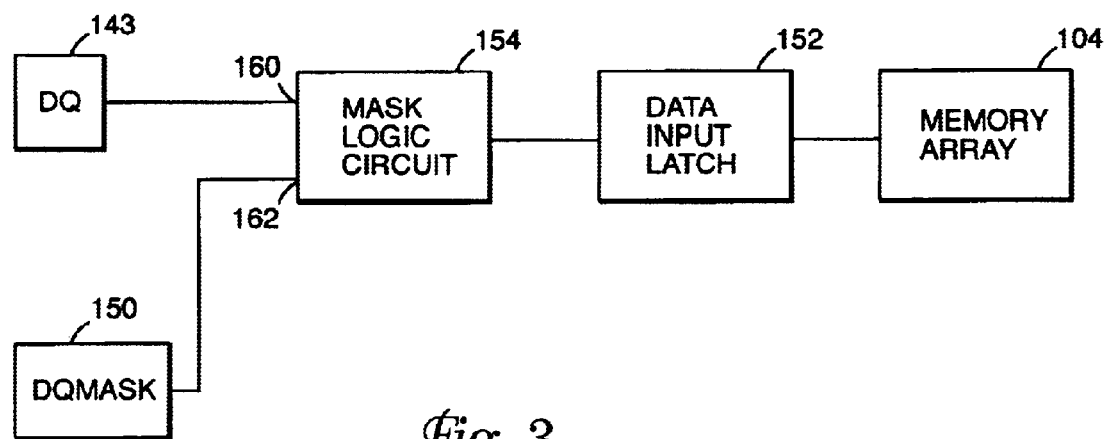
FIG. 3 is a block diagram of another embodiment of the present invention.

In another embodiment, all logic 0 state data, in a data signal, received by the DQ connections 143 are converted to logic 1 state data before they enter the data input latch 152 when the DQMASK is asserted. This embodiment is illustrated in FIG. 3. As illustrated, the DQ connections 143 are directly coupled to the first input 160 of the mask logic circuit 154. Moreover, the DQMASK connection 150 is coupled to the second input 162 of the mask logic circuit 154. An output of the mask logic circuit 154 is coupled to an input of the data input latch 152. An output of the data input latch 152 is then coupled to the memory array 104. In addition, the DQM logic circuit 154 in one embodiment includes a logic OR gate 156, as illustrated in FIG. 4.

In one embodiment, the DQMASK connection 150 includes a DQML and a DQMH connection, as illustrated in FIG. 1. The DQML corresponds to lower address data connections DQ0–DQ7 and DQMH corresponds to upper address data connections DQ8–DQ15. The DQML and DQMH connections allow data in both the lower and upper addresses to be separately masked.

Conclusion

A method of masking input data in a synchronous non-volatile flash memory. According to one embodiment of the present invention, a data mask connection is used to receive a mask signal. The mask signal forces at least a portion of input data having a programmed state to an erased state. In another embodiment, control circuitry is used to control write operations to memory cells of a memory array. In this embodiment, the control circuitry does not write input data having an erased state to the memory array.

What is claimed is:

1. A flash memory device comprising:
   a plurality of non-volatile flash memory cells;
   a data mask connection, coupled to the plurality of non-volatile flash memory cells, to receive a mask signal, wherein the mask signal forces at least a portion of input data having a programmed state to an erased state.

2. The flash memory device of claim 1 further comprising:
   control circuitry to control write operations to non-volatile flash memory cells of a flash memory array, wherein the control circuitry does not write input data having an erased state to the memory array.

3. The flash memory device of claim 1 further comprising:
   a mask logic circuit to output data having an erased state when the mask signal is asserted.

4. The flash memory device of claim 3 wherein the mask logic circuit performs an OR logic function in response to the mask signal and input data.

5. A flash memory device comprising:
   a plurality of non-volatile flash memory cells;
   a data connection to receive an input data signal for storage in at least one of the plurality of non-volatile flash memory cells;
   a data mask connection to receive a mask signal used to selectively mask the input data signal; and
   a mask logic circuit coupled to provide an output data signal in response to the input data signal and the mask signal, wherein the output data signal of the mask logic circuit provides data in a logic 1 state in response to the input data signal having a logic 1 state or the assertion of the mask signal.

6. The flash memory device of claim 5 wherein the mask logic circuit provides a logic OR function.

7. The flash memory device of claim 5 wherein the data mask connection comprises:
   a DQML connection, wherein DQML corresponds to a lower address data connection; and a DQMH connection, wherein DQMH corresponds to an upper address data connection.

8. A flash memory device comprising:

a plurality of non-volatile flash memory cells;

a DQ connection to receive input data for storage in the plurality of non-volatile flash memory cells;

a DQMASK connection to receive an active high mask signal; and a mask logic circuit having a first input coupled to the DQ connection and a second input coupled to the DQMASK connection, wherein the mask logic circuit outputs data having an erased state in response to input data having an erased state or an assertion of the mask signal.

9. The flash memory device of claim 8 further comprising:

a data input latch coupled between the DQ connection and the first input of the mask logic circuit.

10. The flash memory device of claim 8 further comprising:

a flash memory array comprising the plurality of non-volatile flash memory cells; and a data input latch coupled between an output of the mask logic circuit and the memory array.

11. The flash memory device of claim 8 wherein the erased state is a logic 1.

12. A flash memory device comprising:

a memory array having a plurality of non-volatile flash memory cells;

control circuitry to control write operations to the non-volatile flash memory cells, wherein the control circuitry writes only logic 0 data to the memory array;

a DQ connection to receive input data;

a DQMASK connection to receive an active high mask signal; and a mask logic circuit having a first input coupled to the DQ connection and a second input coupled to the DQMASK connection, wherein the mask logic circuit outputs logic 1 data in response to input data having a logic 1 data or an assertion of the mask signal.

13. The flash memory device of claim 12 wherein the mask logic circuit performs an OR logic function.

14. The flash memory device of claim 12 further comprises:

a data input logic circuit coupled between the memory array and the mask logic circuit.

15. The flash memory device of claim 12 further comprises:

a data input logic circuit coupled between the DQ connection and the mask logic circuit.

16. A flash memory system comprising:

a processor to provide input data;

a flash memory to store the input data from the processor, the flash memory comprises memory cells arranged in columns and rows;

a DQ connection coupled to receive the input data;

a DQMASK connection to receive a mask signal used to selectively mask the input data;

a mask logic circuit coupled to provide output data in response to the input data and the mask signal, wherein the output data of the mask logic circuit has a logic 1 state in response to the mask signal; and control circuitry to perform a write operation to store the output data in the memory cells, wherein the control circuitry does not write data having a logic 1 state to the memory cells.

17. The flash memory system of claim 16 wherein the input data comprises data having a logic 1 state and/or data having a logic 0 state.

18. The flash memory system of claim 16 wherein the mask signal is an active high signal.

19. A flash memory system comprising:

a processor to provide input data;

a flash memory array to store the input data, the flash memory array having memory cells arranged in columns and rows;

a DQ connection to receive the input data;

a DQMASK connection to receive a mask signal used to selectively mask at least a portion of the input data having a programmed state to an erased state; and control circuitry to perform a write operation to the memory cells of the flash memory array, wherein the control circuitry does not write data having an erased state to the memory cells.

20. The flash memory system of claim 19 further comprises:

a mask logic circuit coupled to provide output data in response to the input data and the mask signal, wherein the output data of the mask logic circuit provides data having an erased state when the mask signal is asserted.

21. The flash memory system of claim 19 wherein the input data comprises data having a program state and/or an erased state.

22. The flash memory system of claim 19 wherein the mask signal is an active high signal.

23. The flash memory system of claim 19 wherein a programmed state is a logic 0 state.

24. The flash memory system of claim 19 wherein an erased state is a logic 1 state.

25. A flash memory device comprising:

a DQ connection to receive an input data signal;

a data input latch having an input coupled to the DQ connection;

a DQMASK connection to receive a mask signal; and a mask logic circuit having a first input coupled to an output of the data input latch and a second input coupled to the DQMASK connection, wherein the mask logic circuit performs an OR logic function in response to data received on the first input and the second input thus converting select data from a programmed state to an erased state.

26. The flash memory device of claim 25 wherein the mask signal is an active high signal.

27. A flash memory device comprising:

a data connection to receive input data;

a data mask connection to receive a mask signal used to selectively mask at least a portion of the input data having a programmed state to an erased state;

a mask logic circuit having a first input coupled to the data connection and a second input coupled to the data mask connection, wherein the mask logic circuit performs an OR logic function in response to data received on the first input and the second input thus converting the portion of the input data from the programmed state to the erased state; and a data input latch coupled to receive output data from the mask logic circuit.

28. The flash memory device of claim 27 wherein the input data comprises data having a programmed state and/or data having an erased state.

29. A method of operating a flash memory comprising:

receiving input data to be stored in a memory array; and masking select bits of the input data by forcing the select bits to an erased state.

30. The method of claim 29 wherein an erased state is a logic 1.

31. The method of claim 29 wherein masking the select bits comprises performing a logic OR function on the input data.

32. A method of operating a flash memory comprising:

performing a write operation to a flash memory array; and masking a selected portion of input data by changing the selected portion to a logic 1 state data.

33. The method of claim 32 further comprising:

storing only logic 0 state data in memory cells of the memory array.

34. The method of claim 32 further comprising:

storing the input data in a data input latch to buffer the input data before the write operation is performed.

35. The method of claim 32 wherein masking the selected portion is performed in response to an externally provided mask signal.

36. A method of operating a flash memory comprising:

receiving a data signal on a DQ connection to be stored in a memory array;

receiving a mask signal on a DQMASK connection to selectively mask the data signal;

masking the data signal by forcing the data signal to an erased state; and storing only input data having a programmed state in the memory array.

37. The method of claim 36 wherein the data signal comprises data in either a programmed state or an erased state.

38. The method of claim 36 wherein the mask signal is an active low signal.

39. A method of operating a flash memory comprising:

executing a write operation;

masking data to be written to a memory array by forcing a selected portion of the data to an erased state;

storing data having a programmed state in the memory array; and ignoring data in an erased state.

40. The method of claim 39 wherein masking the data comprises:

receiving the data to be stored in the memory array;

receiving a mask signal to selectively mask the data; and logically comparing the data to the mask signal.

41. A method of operating a flash memory having control circuitry, the method comprising:

erasing a block of non-volatile flash memory cells in a flash memory array;

performing a write operation to the block of non-volatile flash memory cells;

masking a selected portion of input data by forcing data having a programmed state in the selected portion to data having an erased state; and storing data having a programmed state in the block of non-volatile flash memory cells.

42. The method of claim 41 wherein the erasing of the block of non-volatile flash memory cells is performed by the control circuitry.

43. The method of claim 41 wherein data having an erased state is not stored in the block of memory cells.

* * * * *